Figure 1:
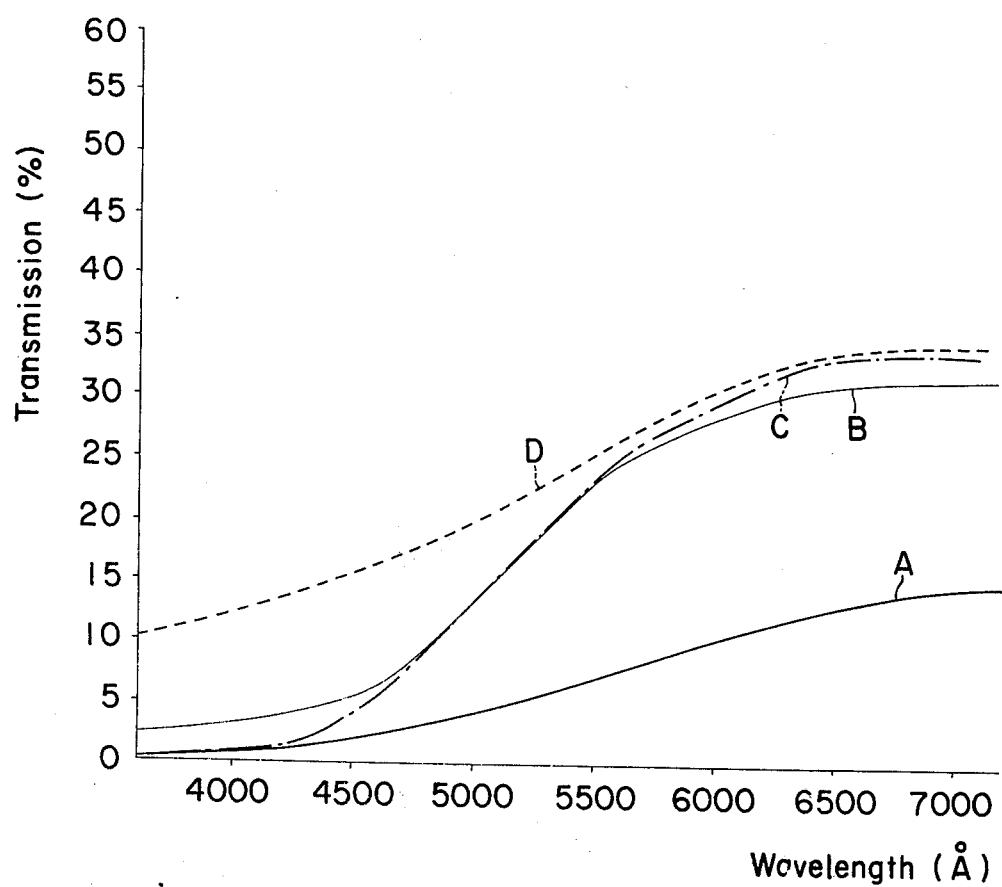

United States Patent [19]
Fujinami et al.

[11] 3,951,547
[45] Apr. 20, 1976

[54] CHROMIUM OXIDE PHOTOMASK MATERIAL AND THE PRODUCTION THEREOF

[75] Inventors: Tomoaki Fujinami, Samukawa; Isao Hattori, Chigasaki, both of Japan

[73] Assignee: Ulvac Corporation, Chigasaki, Japan

[22] Filed: May 19, 1972

[21] Appl. No.: 254,986

[30] Foreign Application Priority Data
May 24, 1971   Japan.................................. 46-34813

[52] U.S. Cl............................. 355/133; 355/125
[51] Int. Cl.$^2$........................................ G03B 27/02
[58] Field of Search .............. 355/125, 133; 148/6.3

[56] References Cited
UNITED STATES PATENTS
3,647,566   3/1972   Szupillo ............................ 355/125

*Primary Examiner*—Richard L. Moses
*Attorney, Agent, or Firm*—Brady, O'Boyle & Gates

[57] ABSTRACT

A colored photomask has a glass substrate with a masking film deposited thereon formed of a non-stoichiometric chromium oxide composition produced by heating chromic oxide or metallic chromium in a clear oxidizing atmosphere of oxygen or an oxygen-nitrogen mixture at a total pressure of $0.5 \times 10^{-4}$ to $5 \times 10^{-4}$ Torr and at an oxygen pressure of $0.1 \times 10^{-4}$ to $5 \times 10^{-4}$ Torr to generate the vapor from the chromic oxide or metallic chromium, and depositing the rising vapor onto one surface of the glass substrate heated and positioned within the oxidizing atmosphere in a manner similar to a known vacuum-plating process, and at least one window in the masking film formed by etching the film.

2 Claims, 1 Drawing Figure

CHROMIUM OXIDE PHOTOMASK MATERIAL AND THE PRODUCTION THEREOF

This invention relates to a new photomask for use in the photo-etching or photoresist processing, and to the production of this new photomask. More particularly, the present invention relates to an improvement in the photomask, usually called the colored mask, which is selectively semitransparent to lights and is colored in appearance and in which the masking film deposited on the glass substrate is made of a metal oxide.

Photomasks are used for defining images on photoresist materials in the manufacture of semiconductor devices, integrated circuits and large-scaled integrated circuits. Thus, a photomask may be a negative or positive pattern or text which acts by absorbing and/or reflecting the incident light in predetermined areas but transmitting the light in the other desired areas to expose and interact with the photoresist which has been applied onto a workpiece to be etched, so that the photoresist is made either more soluble (positive-working photoresist) or less soluble (negative-working photoresist) in the desired exposed areas thereof. To this end, the photomask is provided on its glass support or substrate with a masking film deposited thereon in such areas where the exposing light is desired not to transmit therethrough, and with windows in such areas where the exposing light is desired to transmit therethrough, the windows being shaped in predetermined contours.

Photomasks in present use may be classified into three main types depending upon the nature and condition of the masking film material employed therein. The first type of photomask is the photographic silver emulsion-on-glass mask. The second type of photomask is the metallic chromium-on-glass mask. The third type of photomask is the metal oxide-on-glass mask or the metal sulfide-on-glass mask provided with a masking film made of a metal oxide or sulfide which is selectively semi-transparent, that is to say, is transparent to red to yellow-color lights (for the see-through characteristics) but is opaque and strongly absorbent to lights of wavelength of no more than 4500 A (e.g. the mercury lamp radiations) used to expose the photoresist, for the masking purpose (see the "J. Electrochem. Soc.", Vol. 118, No. 2, pgs. 341–344 (February, 1971)). This third type of photomask is generally colored in appearance and therefore usually called the colored mask.

All the known photomasks of the above-mentioned types suffer from their particular drawbacks. The photographic silver emulsion-on-glass mask is of a limited resolution in the exposed photoresist and is easily scratched and is difficult to clean. The metal chromium-on-glass mask has not the see-through characteristics and is mirror-bright. Disadvantageously, this metal mask is difficult to make the alignment operation of the mask and is highly reflective, likely causing halation effect and resulting in loss of resolution in the exposed photoresist. Besides, the formation of the metal film free from pinholes is difficult.

Among the photomasks of the third type, the known colored masks used at present in practice are limited to those which are provided with the masking film made of silicon mono-oxide (SiO), germanium sulfide (GeS) or ferric oxide ($Fe_2O_3$). However, these practical colored masks, that is, the silicon mono-oxide mask, the germanium sulfide mask and the ferric oxide mask are all not satisfactory in that the surface of the masking film of the silicon mono-oxide, germanium sulfide or ferric oxide is easily scratched and less resistant to the attacks by some chemicals and organic solvents so that it can easily be attached and damaged in the cleaning process which must be carried out by washing with an organic solvent and pickling with acid and/or alkali after each use of the mask. Therefore, the prior colored masks used in practice are disadvantageous in that they must have low service life.

The above-mentioned types of photomasks, including the colored masks, may themselves be manufactured according to the known photo-etching or photoresist process by applying a continuous and uniform film of a masking material on a glass support or substrate, and then applying a coat of a known photoresist (either negative-working or positive-working) uniformly over the top surface of the applied masking material layer to prepare a photomask material. A master mask is superimposed on the top surface of the photoresist coat of the photomask material as prepared, and irradiation with mercury lamp light is then made over the top of the master mask to expose the photoresist in the desired areas of the photomask material and thereby to make the photoresist more soluble or less soluble in the desired areas. The exposed areas or non-exposed areas of the photoresist are then removed by a known development process using a standard photoresist developing agent so as to cause the surface of the underlying masking film of the photomask material to be opened in the desired areas while leaving the other areas of the masking film of the photomask material to remain coated with the photoresist layer which have not been removed. The exposed and developed mask material is subsequently subjected to the etching process using an etching agent so as to remove the masking film which has been opened in the desired areas, while the other areas of the masking film which still remain coated with the photoresist layer are left unaffected by the etching agent. In this way, the masking film of the photomask material which is initially continuous is etched away in the desired areas thereof corresponding to the patterns of the master mask to give the windows of predetermined contours or patterns. The photomask material which has undergone the etching process in the above-mentioned manner is then subjected to finishing treatments such as removal of the remaining photoresist and rinsing with water etc., to give a finished photomask. Accordingly, it is necessary for the masking film material of the photomask material to be reasonably etchable when using an appropriate etching agent, in spite of that it is desired that the masking film of the finished photomask should naturally be mechanically hard, hardly scratchable and chemically highly resistant to the attack by such organic solvents as well as acids and alkalis which are frequently used in the cleaning step for the photomask once used.

An object of the present invention is to provide a new photomask material which is readily etchable and be suitable for use in the manufacture of an improved colored mask fitted with a masking film which is mechanically more hard, less scratchable and chemically much more highly resistant to chemicals and which can afford a longer service life to the photomask than the prior colored masks. A further object of the present invention is to provide such an improved colored mask fitted with a masking film of a chromium oxide which is durable and selectively semitransparent, and to provide a method for manufacturing such an improved colored mask by using a new etching solution. Another objects of the present invention will be apparent from the following descriptions.

As a result of our extensive researches, we have now found that when a clear oxidising atmosphere consisting of oxygen or a mixture of oxygen with nitrogen which may be air, a mixture of air with oxygen or a mixture of air with nitrogen is established at a total pressure of $0.5 \times 10^{-4}$ to $5 \times 10^{-4}$ Torr and at an oxygen pressure of $0.1 \times 10^{-4}$ to $5 \times 10^{-4}$ Torr, vapor is then generated from chromic oxide ($Cr_2O_3$) or metallic chromium by heating it under said clear oxidising atmosphere at the aforesaid reduced pressure and the rising vapors are deposited onto a hot glass substrate in a manner similar to the known vacuum-plating process, the film formed on the glass substrate in this way comprises chromium oxide material which does neither exist simply in the form of the chromic oxide ($Cr_2O_3$) nor in the form of chromous oxide (CrO) nor in the form of chromium (IV) di-oxide ($CrO_2$) nor in the form of chromium (VI) oxide ($CrO_3$) but is in the form of a non-stoichiometric chromium oxide composition of which the relative proportions of the oxygen and chromium atoms as determined by chemical analysis do not precisely correspond to the specific, stoichiometric proportion of the oxygen atoms to the chromium atoms normally present in anyone of the already known, various chromium oxides such as CrO, $Cr_2O_3$, $CrO_2$ and $CrO_3$ etc. Though the exact nature of the aforesaid non-stoichiometric chromium oxide composition formed in the above-mentioned way has not yet been elucidated, it is assumed that this non-stoichimetric chromium oxide composition consists of a mixture of some known chromium oxides of different types such as CrO, $CrO_2$, $CrO_3$, $CrO_5$ and others. It has also been found that the deposited film formed of said non-stoichiometric chromium oside composition is selectively semitransparent, in other words, is transparent to yellowish brown color light but strongly absorbs and is substantially opaque to the actinic radiations of mercury lamp of wavelength of no more than 4500 A which are usually employed for exposing the photoresist. This is very unexpected in view of the fact that the film formed by vacuum-plating the chromic oxide in a vacuum at $5 \times 10^{-6}$ Torr or less normally shows a significant transmission of the ultra-violet lights which is too high to be used as the masking film in a photomask.

Furthermore, it has also been found that the non-stoichiometeric chromium oxide composition film of uniform quality can be reproduced on the glass substrate with high reproducibility as long as the same procedure and constant operating conditions are employed in the deposition process under a clear oxidising atmosphere of a given composition. It has been noted that the non-stoichiometric chromium oxide composition film deposited on the glass substrate is firmly adhering to the glass, is highly resistant to abrasion and is considerably resistant to the attack by various acids, alkalis and organic solvents. Accordingly, we have appreciated that the film of the non-stoichiometric chromium oxide composition which has been deposited on the glass by vacuum-plating the chromic oxide or metallic chromium under the above-mentioned clear oxidising atmosphere at a total pressure of the above specified range and at an oxygen pressure of the above specified range may be useful for the photomask.

Then we have made our further research to seek for an appropriate etching agent which is able to etch the film of the non-stoichiometric chromium oxide composition rapidly and smoothly under moderate etching conditions and which is compatible with the photoresist coat present. As a result, we have found that a solution of sulfuric acid and ceric sulfate $Ce(SO_4)_2$ in water as well as a solution of ammonium cerium nitrate $(NH_4)_2Ce(NO_3)_5$ and perchloric acid $HC1O_4$ in water are not only capable of etching the film of the non-stoichiometric chromium oxide composition but also are compatible with the photoresist coat. Thus, when using an aqueous solution of sulfuric acid and ceric sulfate or an aqueous solution of ammonium cerium nitrate and perchloric acid as the etching solution, the aforesaid non-stoichiometric chromium oxide composition film can rapidly and smoothly be etched at ambient temperatures, that is, at a solution temperature of about 15°–25°C without deteriorating the photoresist coat and reducing the covering power of the photoresist coat during the etching process, without flaking away the photoresist from the glass and without bringing about any irregular corrosion in the oxide film.

According to a first aspect of the present invention, therefore, there is provided a colored mask material comprising a glass substrate and a continuous masking film deposited on the glass substrate, said masking film being formed of a chromium oxide material (that is, the non-stoichiometric chromium oxide composition) which has been produced by heating chromic oxide or metallic chromium under a clear oxidising atmosphere consisting of oxygen or a mixture of oxygen and nitrogen established at a total pressure of $0.5 \times 10^{-4}$ to $5 \times 10^{-4}$ Torr and at an oxygen pressure (partial) of $0.1 \times 10^{-4}$ to $5 \times 10^{-4}$ Torr to generate vapor from the chromic oxide or metallic chromium and depositing the rising vapor onto one surface of the glass substrate heated and positioned within said clear oxidising atmosphere in a manner similar to the usual vacuum-plating process.

The preparation of the colored mask material according to the above-mentioned first aspect of the present invention is now described. The formation of the film of the non-stoichiometric chromium oxide composition deposited on the glass substrate may be carried out using a vacuum vessel fitted with a vacuum gauge and a vacuum pump which has usually been employed in the known vacuum-plating or vacuum-evaporation process. The vacuum vessel may be provided on its one lateral side or bottom with an inlet tube which leads to storage tanks containing pure or commercial grade oxygen or a mixture of oxygen and nitrogen, in order to permit the necessary oxidising atmosphere to be introduced and established in the vessel via said inlet tube. Heaters, preferably electric resistance heaters are arranged at appropriate positions in the vacuum vessel in order to heat the evaporating source material (namely, the chromic oxide or metallic chromium) which may be placed in a small container fitted with a cover, and in order to heat the glass substrate on which the oxide film is to be deposited and is being deposited. In the preparation of the colored mask material according to the present invention, it is essentially necessary that the "clear oxidising atmosphere" should be established in the vacuum vessel and prevail in the vessel throughout the vacuum-plating process. By the term "clear oxidising atmosphere" is meant that this oxidising atmosphere is substantially free such gaseous and vapory contaminants of unknown natures which can inevitably be released from the surfaces such as the inner sides of the vacuum vessel, the surfaces of equipments thereof, the vacuum pump, the heated glass substrate and the heated evaporating source material as well as the lubricating greases, etc., when the vacuum vessel has been evacuated to a high vacuum of $5 \times 10^{-6}$ Torr or less. The clear oxidising atmosphere may be established in the vacuum vessel by evacuating the vacuum vessel at first to a high vacuum of $5 \times 10^{-6}$ Torr or less, maintaining this high vacuum in said vessel for a while, then introducing an amount of pure or commercial grade oxygen or a mixture of oxygen and nitrogen into the interior of the vessel and discharging therefrom to purge the possible contaminant gases and vapors from the vessel and finally introducing pure or commercial grade oxygen or a mixture of oxygen and nitrogen into the vessel to a predetermined total pressure to allow an oxidising atmosphere to prevail within the vessel. This oxidising atmosphere present in the vacuum vessel essentially consists of pure or commercial grade oxygen alone or a mixture of oxygen and nitrogen which may either be a cleaned air itself, or an admixture of cleaned air and commercial grade oxygen added, or an admixture of cleaned air and commercial grade nitrogen added. The total pressure of the oxidising atmosphere prevailing in the vacuum vessel may be adjusted to a suitable value in the above specified range of $0.5 \times 10^{-4}$ to $5 \times 10^{-4}$ Torr, by controlling amount of the oxygen or the oxygen-nitrogen mixture introduced in the vessel and may be measured by the vacuum gauge which is mounted in the vessel. The oxygen pressure of the oxidising atmosphere which prevails in the vacuum vessel may be adjusted to a suitable value in the above specified range of $0.1 \times 10^{-4}$ to $5 \times 10^{-4}$ Torr, by selecting suitably the amount of oxygen fed are the proportion of oxygen in the oxygen-nitrogen mixture which is or has been introduced into the vessel. In case the oxidising atmosphere is formed in the vessel by introducing separate flows of oxygen and nitrogen or separate flows of air and oxygen or separate flows of air and nitrogen into the vessel, the (partial) oxygen pressure of the oxidising atmosphere may be adjusted by controlling the relative flow rates of these gases introduced. It is possible that a volume of either pure or commercial grade oxygen, or a mixture of oxygen and nitrogen, or pure or commercial grade nitrogen, or cleaned air is initially introduced into the vacuum vessel to a pressure below the final desired total pressure of the oxidising atmosphere and then an additional volume of nitrogen or air or oxygen etc., is introduced into the vessel to adjust the relative proportions of oxygen and nitrogen which are present in the established oxidising atmosphere, and thus to attain a desired oxygen pressure of the atmosphere. It is needless to say that the oxygen pressure of the oxidising atmosphere should equal to the total pressure of the oxidising atmosphere when this atmosphere consists of oxygen alone in the vacuum vessel, and that the oxygen pressure of the oxidising atmosphere should exactly be termed as the partial oxygen pressure when said atmosphere consists of a mixture of oxygen and nitrogen.

In preparing the mask material according to the present invention, it is preferred that the heating of the glass substrate on which the non-stoichiometric chromium oxide composition film is to be deposited is so programmed that the glass plate heated reaches a temperature of 350°-500°C and is kept in the hot state at that temperature just when the clear oxidising atmosphere has been established at a desired total pressure and at a desired (partial) oxygen pressure within the vacuum vessel. After this, the container containing pieces or granules etc., of chromic oxide or chromium metal as the evaporating material is opened by removing the cover from the top of the container, and the vapor is generated from the evaporating material and rise upward to pass through the prevailing clear oxidising atmosphere and deposit onto the hot surface of the glass substrate which is positioned above said container, so that the non-stoichiometric chromium oxide composition is applied as a continuous and uniform film to the lower surface of the glass plate which is facing to the container of the evaporating material. Taking into consideration the fact that the chromium oxide composition forming the film deposited in this way is non-stoichiometric is stated in the above, it is presumed that the rising vapor generated from the chromic oxide undergoes at least any dissociation and oxidation under the action of the vacuum as well as the action of the oxidising atmosphere during the passage of the rising vapor through the clear oxidising atmosphere, and that the metal vapor generated from the chromium metal also undergoes at least any oxidation under the action of the clear oxidising atmosphere. In this way, the film of the non-stoichiometric chromium oxide composition is deposited on the glass substrate or plate in the same manner as in the known vacuum-plating or vacuum-evaporation process except that the color oxidising atmosphere at a total pressure of $0.5 \times 10^{-4}$ to $5 \times 10^{-4}$ Torr, and a (partial) oxygen pressure of $0.1 \times 10^{-4}$ to $5 \times 10^{-4}$ Torr should intentionally be present in the system wherein the vacuum-plating process takes place. In preparing the mask material according to the present invention, the vacuum-plating process may proceed until the non-stoichiometric chromium oxide composition film deposited has a thickness of 2000 to 6000 A. The transmission of the film of the non-stoichiometric chromium oxide composition for incident lights varies depending on the wavelengths of the lights as well as the film thickness, and it is desired that the film of the non-stoichiometric chromium oxide composition deposited in the colored mask material of the present invention should have at least a thickness which is sufficient to give a transmission of less than 5% for lights of no more than 4500 A in wavelength, as otherwise the film would not achieve is masking action effectively.

For instance, we prepared some colored masks according to the present invention by evacuating a vacuum vessel at first to a high vacuum of $1 \times 10^{-6}$ Torr, maintaining this high vacuum for a while, passing a stream of pure oxygen through said vessel for purging and then establishing a clear oxidising atmosphere consisting of oxygen and nitrogen at a total pressure of $1 \times 10^{-4}$ Torr and at a (partial) oxygen pressure of $0.1 \times 10^{-4}$ Torr, and a clear oxidising atmosphere consisting of pure oxygen alone at an oxygen pressure of $1 \times 10^{-4}$ Torr (= the total pressure) within the vacuum vessel, respectively, in two separate runs. Under these oxidising atmospheres, an amount of chromic oxide was heated an evaporated so that the generated vapor rose upward and passed through the oxidising atmosphere to deposit onto the lower surface of the glass slides which were positioned in said oxidising atmosphere above the container for the chromic oxide and which were kept at 400°C. This vacuum-plating process was continued unitl the oxide film deposited on the glass slides had a thickness of 2200 A. The procedure of the above runs was repeated using a clear oxidising atmosphere of commercial grade oxygen alone at a (total) oxygen pressure of $5 \times 10^{-4}$ Torr and continuing the vacuum-plating process to a film thickness of 6000 A. Thus, three mask materials of the present invention in which the masking film was formed of the non-stoichiometric chromium oxide composition were prepared, and these materials were then determined for their spectral absorption properties which are diagrammatically shown in the attached drawing. On the other hand, glare-reducing glasses or sun-glasses were made in a conventional manner by evacuating the same vacuum-vessel to a high vacuum of $1 \times 10^{-5}$ Torr, and then immediately heating and evaporating chromic oxide to deposit the chromic oxide film on glass slides at that high vacuum exactly in the same way as in the known vacuum-plating process until the chromic oxide film deposited gained a thickness of 2200 A. The glare-reducing glasses so prepared were again determined for their spectral absorption properties which are also shown in the attached drawing, for composition.

In the attached drawing:

FIG. 1 shows a curve (A) of absorption spectrum of one colored mask material of the present invention as prepared by carrying out the vacuum-plating process under the oxidising atmosphere consisting of a mixture of oxygen and nitrogen at a total pressure of $1 \times 10^{-4}$ Torr, and at a (partial) oxygen pressure of $0.1 \times 10^{-4}$ Torr until a film thickness of 2200 A; a curve (B) of absorption spectrum of the other colored mask material of the present invention as prepared by effecting the vacuum-plating process under the oxidising atmosphere of oxygen alone at a (total) oxygen pressure of $1 \times 10^{-4}$ Torr, until a film thickness of 2200 A; a curve (C) of absorption spectrum of the further colored mask material of the present invention as prepared by effecting the vacuum-plating process under the oxidising atmosphere of oxygen alone at a (total) oxygen pressure of $5 \times 10^{-4}$ Torr, until a film thickness of 6000 A; and a curve (D) of absorption spectrum of the conventional glare-reducing glasses as prepared by vacuum-plating chromic oxide at a high vacuum of $1 \times 10^{-5}$ Torr in the usual manner.

Referring to FIG. 1, a comparison between the curves A, B and C shows that the configuration of the absorption spectrum curves of the colored masks of the present invention tend to approach to a horizontal straight line as the (partial) oxygen pressure of the oxidising atmosphere decreases. That is to say, a decrease in the (partial) oxygen pressure of the oxidising atmosphere results in that the non-stoichiometric chromium oxide composition film deposited has a reduced selectivity between the transmission of the lights of wavelengths of no more than 4500 A which is usually employed for exposing the photoresist, and the transmission of the lights of wavelengths of 5500–6000 A which are usually employed for alignment of the photomask. If chromic oxide or metallic chromium is evaporated under a clear oxidising atmosphere at an oxygen pressure of less than the value of $0.1 \times 10^{-4}$ Torr, which is the lower limit specified for the present invention, the oxide film deposited is then too poorly selective in the transmission of radiations to be suitable for use in the photomask, and at the same time it shows reduced transmissions for all lights in the wavelength region of 4000–7000 A. Furthermore, it has been found that as the oxygen pressure of the clear oxidising atmosphere employed increases, the non-stoichiometric chromium oxide composition film deposited is then likely to exhibit a more or less reduced masking effect for the exposing lights. Besides, it has been observed that in case the oxygen pressure of the clear oxidising atmosphere employed is above the upper-limit value of $5 \times 10^{-4}$ Torr, as specified according to the present invention, the oxide film deposited on the glass substrate is likely to be flaked away from the support, that is, it adheres to the glass too weakly to be used as a durable masking film.

Another series of tests were carried out to extimate the effects of varying total pressure of the clear oxidising atmospheres employed while the oxygen pressure of the atmosphere was kept at a given value. The results of tests otained then reveal that the adhesive power of the oxide film deposited on the glass substrate is too low to be used as a durable masking film in the photomask in case the total pressure of the atmosphere is above the upper-limit value of $5 \times 10^{-4}$ Torr, as specified according to the present invention, and that the oxide film deposited does not exhibit a sufficiently high selectivity in the transmission of lights to be suitable for use in the photomask, in case the total pressure of the oxidising atmosphere employed is below the lower-limit value of $0.1 \times 10^{-4}$ Torr. Probably, this is due to that the amounts of the gaseous and vapory contaminants which can be released from the surfaces would increase to an undesirably high level, because the oxidising atmosphere at such a too low total pressure can not prevent effectively the contaminant gases and vapors from releasing from the surfaces.

Referring to the curve D of the absorption spectrum of the conventional glare-reducing glasses as shown in FIG. 1, it may be seen that the normal chromic oxide film of this glasses is at about 10–16% in the transmission of lights of wavelengths of no more than 4500 A which are usually employed for exposing the photoresist, and that such chromic oxide film of the glare-reducing glasses does not exhibit the masking effect for the exposing light if it would be used as a photomask. Besides, it has been found that the normal chromic oxide film of the glare-reducing glasses is etchable only when using a boiling mixture of concentrated sulfuric acid and potassium bichromate which can deteriorate all the known photoresists and hence is not compatible with the conventional photoresist processing.

Using the colored mask material so prepared according to the present invention, there may be produced an improved colored mask in which windows of predetermined patterns have been formed in the masking film thereof, by subjecting said mask material to a usual photoresist process but with a new etching solution which is either an aqueous solution of sulfuric acid and ceric sulfate or an aqueous solution of ammonium cerium nitrate and perchloric acid. To produce a colored photomask from the mask material of the present invention, the mask material is coated on its one side with a continuous layer of 2000–5000 A thick and made of a known positive-working or negative-working photoresist for example, a photosensitive polyer formulation sold under a trade name PHOTO RESIST AZ-1350 (a product of Shipley Co., U.S.A.), subsequently exposed to mercury lamp lights while placing a master mask superimposed on the top of said mask material and then subjected to a usual development process with a known developing agent for the photoresist employed, in a manner conventional to processing the known silicon mono-oxide mask, germanium sulfide mask and iron oxide mask which have been used in practice. After this development process, the exposed and developed mask material of the present invention is etched at ambient temperature by immersing in the etching solution of sulfuric acid-ceric sulfate in water or in the etching solution of ammonium cerium nirate-perchloric acid in water. It is suitable that the etching solution of sulfuric acid-ceric sulfate in water contains 50–200 g of ceric sulfate $Ce(SO_4)_2$ and 10–100 g of sulfuric acid $H_2SO_4$ per litre of water, and that the etching solution of ammonium cerium nitrate-perchloric acid in water contains 100–300 g of ammonium cerium nitrate $(NH_4)_2Ce(NO_3)_5$ and 20–100 g of perchloric acid $HClO_4$ per liter of water. Particularly, the aqueous etching solution of sulfuric acid-ceric sulfate should preferably be such one as prepared by dissolving 10 g of ceric sulfate and 5 cc of concentrated sulfuric acid in 100 cc of water. The aqueous etching solution of ammonium cerium nitrate-perchloric acid should preferably be such as prepared by dissolving 100 g of ammonium cerium nitrate $(NH_4)_2Ce(NO_3)_5 \cdot x\ H_2O$ and 26 cc of aqueous 70% perchloric acid $HClO_4$ in 440 cc of water.

The film of the non-stoichiometric chromium oxide composition in the mask material of the present invention may rapidly be etched at a reasonably high rate of about 200 A/minute when using the aqueous etching solution of sulfuric acid-ceric sulfate at a solution temperature of 15°–25°C, and it may be etched also at a much higher rate of about 1000–4000 A/minute when using the aqueous etching solution of ammonium cerium nitrate-perchloric acid at a solution temperature of 15°–25°C. Accordingly, when the non-stoichiometric chromium oxide composition film of the mask material according to the present invention is etched using the aqueous etching solution of ammonium cerium nitrate-perchloric acid in particular, the etching treatment can be completed in a short time of about 5 minutes, insuring that the photoresist coat does neither deteriorate nor reduce its covering or protecting power nor flake away from the underlying oxide film during the etching process and also insuring that the masking film formed of the non-stoichiometric chromium oxide composition can be etched exactly only in the desired areas without involving any irregular corrosion of the masking film and without causing the edges of the oxide material present adjacently to the windows (formed as the result of the ething treatment) to be tapered. With the aqueous etching solution of ammonium cerium nitrate-perchloric acid, therefore, it has been found possible to achieve the etching treatment at an accuracy of 90% or more. Although the aqueous etching solution of sulfuric acid-ceric sulfate is of a more or less lower etching performance then the aqueous etching solution of ammonium cerium nitrate-perchloric acid, the former is also able to achieve the etching process in a reasonably short time and at a reasonable high accuracy.

After this etching treatment, the etched mask material of the present invention may then be rinsed with water and undergoes the known finishing treatments, including removal of the remaining photoresist, to give a finished colored photomask.

According to a second aspect of the present invention, therefore, there is provided a colored mask comprising a glass substrate; a masking film deposited on the glass substrate and formed of a non-stoichiometric chromium oxide composition as produced by heating chromic oxide or metallic chromium under a clear oxidising atmosphere consisting of oxygen or an oxygen-nitrogen mixture at a total pressure of $0.5 \times 10^{-4}$ to $5 \times 10^{-4}$ Torr, and at an oxygen pressure (partial) of $0.1 \times 10^{-4}$ to $5 \times 10^{-4}$ Torr, to generate the vapor from the chromic oxide or metallic chromium and depositing the rising vapor onto one surface of the glass substrate heated and positioned within said oxidising atmosphere in a maner similar to the usual vacuum-plating process; and at least one window which has been formed in said masking film by etching the latter.

According to a further aspect of the present invention, there is also provided a method of manufacturing a colored mask, which comprises applying uniformly a known photoresist onto a top surface of such a colored mask material comprising a glass substrate and a continuous masking film deposited on the glass substrate and formed of a non-stoichiometric chromium oxide composition as produced by heating chromic oxide or metallic chromium under a clear oxidising atmosphere consisting of oxygen or an oxygen-nitrogen mixture at a total pressure of $0.5 \times 10^{-4}$ to $5 \times 10^{-4}$ Torr and at an oxygen pressure (partial) of $0.1 \times 10^{-4}$ to $5 \times 10^{-4}$ Torr to generate the vapor from the chromic oxide or metallic chromium and depositing the rising vapor onto one surface of the glass-substrate heated and positioned within said oxidising atmosphere in a manner similar to the usual vacuum-plating process; exposing the photoresis coated mask material under a master mask superimposed thereon; developing the exposed photoresist coating in a known manner and then etching the masking film in the desired areas from which the photoresist has been dissolved out by the development step, the etching step being effected at ambient temperature using an etching solution selected from a solution of sulfuric acid and ceric sulfate in water and a solution of ammonium cerium nitrate and perchloric acid in water.

The colored mask material of the present invention as well as the finished colored mask manufactured therefrom according to the present invention are yellowish brown in color and selectively semitransparent, that is to say, are reasonably transparent to yellowish to red light to allow observation for the alignment purpose ("see-through") but strongly absorbent to the light (mercury lamp radiations of wavelength of no more than 4500 A) used in the exposure process of the photoresist (for masking).

It is generally required that the photomasks, including the colored masks, should be highly resistant to various chemicals and organic solvents. This is because the photomasks can inevitably be contaminated by greases and dusts etc., as well as the residue of the photoresist employed during use and must be cleaned after each use thereof, by washing with an organic solvent such as acetone, trichloroethylene etc., and/or by acid-pickling etc. The colored mask according to the present invention is much more highly resistant to various chemicals and organic solvents, than the prior art colored masks such as the silicon mono-oxide mask, germanium sulfide mask and iron oxide mask previously utilised in practice. The resistance of the colored mask of the present invention to various chemicals was tested to make a comparison to that of the prior art colored masks. The results are shown in the following table.

TABLE 1

| Chemicals | Colored mask of this invention | Prior GeS mask | Prior $Fe_2O_3$ mask | Prior emulsion silver mask |
|---|---|---|---|---|
| 95% Concentrated sulfuric acid | Not attacked | Attacked | Attacked | Attacked |
| 35% Hydrochloric acid | Not attacked | Not attacked | Attacked | Attacked |
| 60% nitric acid | Not attacked | Not attacked | Not attacked | Attacked |
| Bichromic acid | Not attacked | Attacked | Attacked | Attacked |
| Aqua regia | Not attacked | Attacked | Attacked | Attacked |
| 60% sodium hydroxide | Not attacked | Attacked | Attacked | Attacked |

In addition, the colored mask according to the present invention is of a highly improved resistance to scratching by means of steel ball, as compared to the prior colored masks. In consequence, the colored mask of the present invention may have a very much prolonged service life than the various colored mask of the prior art. Resistance to abrasion (scratching by means of steel ball) was tested for the colored mask of the present invention as well as the prior art colored masks of the various types, and the test results obtained are tabulated in the following table.

TABLE 2

| Masks | Loading (g) on the steel ball required to scratch the mask |
|---|---|
| Colored mask of the present invention | 500 |
| Prior GeS mask | 100 |
| Prior $Fe_2O_3$ mask | 300 |

Furthermore, the non-stoichiometric chromium oxide masking film of the colored mask of the present invention advantageously has a lower reflectivity for the light, hence decreasing the probability of the halation effect which can result in loss of resolution in the exposed photoresist. Accordingly the colored mask of the present invention are able to provide improved fildelity and definition of the exposed photoresist.

The above-mentioned advantageous properties of the colored mask of the present invention and hence of the masking film of the non-stoichiometric chromium oxide composition as produced according to the present invention are very surprising in view of the facts that the normal chromic oxide film as in the known glare-reducing glasses is known to have the spectral absorption properties unsuitable for use in the photomask (see the above-mentioned "J. Electrochem. Soc." Vol. 118, No. 2, pgs. 341–344 (February 1971)), and that the normal chromic oxide film is, in fact, etchable only by using a boiling mixture of concetrated sulfuric acid and bichromic acid which would undesirably deteriorate all the known photoresists and be incompatible with the photoresist processing. It is also to be noted that, as will be seen from the curve D of the absorption spectrum of the normal chromic oxide film as in the glare-reducing glasses, the chromic oxide film can exhibit a considerably high transmission of about 10–16% for the light of wavelength of no more than 4500 A at a film thickness of 2200 A and is not enough selectively semitransparent to be used as the masking film of the photomask.

The present invention is now illustrated with reference to the following Examples which are only illustrated but do not limit the scope of the invention in any way.

EXAMPLE 1

A cleaned glass slide measuring 12 cm × 15 cm and 2.3 mm thick was placed in position in a vacuum vessel fitted with a vacuum gauge, an vacuum pump and an inlet tube for gas, and the vacuum pump was then operated to evacuate said vessel. When the vacuum vessel was evacuated to a vacuum of $1 \times 10^{-3}$ Torr, the heating of the glass slide was commenced by passing electric current through an electric-resistance heater which was provided just above said glass slide. At the same time, it was started to heat electrically pieces of chromic oxide which were placed in a container fitted with a cover and arranged on the bottom of the vacuum vessel, so that the glass slide was raised to a temperature of 400°C just when the vacuum vessel had been evacuated to a vacuum of $1 \times 10^{-5}$ Torr or less. After the glass slide temperature of 400°C and the vacuum of $1 \times 10^{-5}$ Torr or less were maintained for a few minutes in the vacuum vessel, a mixture of commertial grade oxygen and air (1:1 ratio by volume) was passed via said gass inlet tube through the vacuum vessel for purging. After this, the operation of the vacuum pump was stopped, and a further amount of said mixture of oxygen and nitrogen was fed into said mixture of oxygen and nitrogen was fed into said vessel, so that a clear oxidising atmosphere consisting of said oxygen-nitrogen mixture at a total pressure of $2 \times 10^{-4}$ Torr and at a partial oxygen pressure of $1 \times 10^{-4}$ Torr prevailed in said vacuum vessel. When the glass slide had again reached 400°C, the cover was removed from the top of the container containing the chromic oxide pieces, whereupon vapor was continued to be generated from the chromic oxide pieces and rose within said atmosphere to give a deposited chromium oxide composition film on the lower face of the glass slide. This vacuum-plating process was effected for 3 minutes. The heating of the devices was then ceased, and a stream of air was slowly introduced into the vacuum vessel so that the pressure in the vacuum vessel increased to the atmospheric pressure. The glass slide so treated was then removed out of the vacuum vessel. The deposited chromium oxide composition film which adhered onto the lower face of the glass slide was shown to have a thickness of 3000 A. In this way, a photomask material with a continuous masking film formed of the non-stoichiometric chromium oxide composition was prepared. Absorption spectral properties of this photomask material so prepared were measured, and it was found that this material showed a transmission of about 0.5% for the lights of no more than 4500 A in wavelength as well as a transmission of about 10–50% for the lights of 5500–7000 in wavelength.

A commercially available negative-working photoresist (sold under a trade name PHOTO-RESIST AZ-1350) was applied uniformly to a thickness of 3000 A onto the top surface of the continuous oxide film of the mask material to produce a photoresist-coated mask material.

A master mask for use in the production of an integrated circuit device was then superimposed on the above-mentioned photoresist-coated mask material.

and the assembly was subjected to an exposure process by irradiating with mercury lamp lights of wavelengths of no more than 4500 A to expose and make the photoresist more soluble in the desired areas. The exposed mask material was then treated by a commercial available developing agent which was appointed for the photoresist employed, to dissolve out the exposed areas of the photoresist. The developed mask material was then immersed for 5 minutes in an etching solution of 10 g of ceric sulfate $Ce(SO_4)_2$ and 5 cc of 95% concentrated sulfuric acid in 100 cc of water at ambient temperature, while the etching solution was gently stirred sometimes during the immersion of the mask material. The etched mask material was then removed from the etching bath, and the photoresist residue was eliminated therefrom and the mask material was rinsed with water to give a finished photomask product.

This finished photomask could be reused 25 times in the manufacture of the integrated circuit device and showed a reasonably high masking accuracy in each use thereof.

EXAMPLE 2

The procedure of Example 1 was repeated to prepare a similar photomask material. This photomask material was then coated with the same photoresist as used in Example 1 and then exposed for 4–6 seconds under the master mask superimposed thereon by irradiating with the mercury lamp lights. The exposed mask material was subjected to the developing process in a similar way to Example 1. The developed mask material was then immersed for about 2 minutes in an etching solution of 100 g of ammonium cerium nitrate $(NH_4)_2Ce(NO_3)_5$ and 26 cc of aqueous 70% perchloric acid $HClO_4$ in 440 cc of distilled water at ambient temperature with occasionally stirring the etching bath gently.

The etched mask material was removed from the etching bath, and the photoresist residue was eliminated from the top face of the non-stoichiometric chromium oxide composition film of the photomask which was subsequently washed with water to give a finished colored mask product.

This colored mask product showed an accuracy of 0.7 $\mu$ and a prolonged service life that it could be reused 25 times or more.

What we claim is:

1. A colored mask comprising a glass substrate and a discontinuous masking film on said glass substrate having a thickness of from about 2000 to about 6000 A which is transparent to yellowish-brown color light and transmits less than 5% of light having a wavelength of no more than 4500 A, said masking film consisting essentially of a single layer of non-stoichiometric chromium oxide composition wherein the proportions of different types of chromium oxides comprising said layer are substantially the same as those in a layer produced by heating a member selected from the group consisting of chromic oxide and metallic chromium in an oxidizing atmosphere consisting essentially of oxygen or an oxygen-nitrogen mixture at a total pressure of $0.5 \times 10^{-4}$ to $5 \times 10^{-4}$ Torr and at an oxygen partial pressure of $0.1 \times 10^{-4}$ to $5 \times 10^{-4}$ Torr to generate vapor therefrom and depositing said vapor onto a surface of heated glass substrate positioned within said oxidizing atmosphere.

2. A material adapted for etching to form a mask material comprising a glass substrate and a masking film on said glass substrate having a thickness of from about 2000 to about 6000 A which is transparent to yellowish-brown color light and transmits less than 5% of light having a wavelength of no more than 4500A, said masking film consisting essentially of a single layer of non-stoichiometric chromium oxide composition wherein the proportions of different types of chromium oxides comprising said layer are substantially the same as those in a layer produced by heating a member selected from the group consisting of chromic oxide and metallic chromium in an oxidizing atmosphere consisting essentially of oxygen or an oxygen-nitrogen mixture at a total pressure of $0.5 \times 10^{-4}$ to $5 \times 10^{-4}$ Torr and at an oxygen partial pressure of $0.1 \times 10^{-4}$ to $5 \times 10^{-4}$ Torr to generate vapor therefrom and depositing said vapor onto a surface of heated glass substrate positioned within said oxidizing atmosphere.

* * * * *